(12) United States Patent
Chiu (10) Patent No.: US 7,479,883 B2
(45) Date of Patent: Jan. 20, 2009

(54) RFID VERIFIER

(75) Inventor: Lihu M. Chiu, Arcadia, CA (US)

(73) Assignee: Printronix, Inc., Irvine, CA (US)

( * ) Notice: Subject to any disclaimer, the term of this patent is extended or adjusted under 35 U.S.C. 154(b) by 212 days.

(21) Appl. No.: 11/497,189

(22) Filed: Aug. 1, 2006

(65) Prior Publication Data

US 2007/0013522 A1    Jan. 18, 2007

Related U.S. Application Data

(63) Continuation-in-part of application No. 10/942,200, filed on Sep. 16, 2004, now Pat. No. 7,221,278.

(51) Int. Cl.
    *G08B 13/14* (2006.01)
(52) U.S. Cl. .......... 340/572.4; 340/10.3; 340/10.4; 455/67.7
(58) Field of Classification Search .......... 340/572.1, 340/572.4, 505, 10.1, 10.3, 10.4, 10.6; 455/67.14, 455/67.7; 342/118, 147
See application file for complete search history.

(56) References Cited

U.S. PATENT DOCUMENTS

| | | | | |
|---|---|---|---|---|
| 5,983,363 A * | 11/1999 | Tuttle et al. | ................ | 714/25 |
| 6,414,626 B1 * | 7/2002 | Greef et al. | ................ | 342/127 |
| 6,784,789 B2 * | 8/2004 | Eroglu et al. | ................ | 340/10.6 |
| 2004/0203478 A1 * | 10/2004 | Scott | ................ | 455/70 |
| 2006/0068701 A1 * | 3/2006 | Chapman et al. | ................ | 455/41.1 |
| 2006/0097874 A1 * | 5/2006 | Salesky et al. | ................ | 340/572.1 |
| 2007/0001814 A1 * | 1/2007 | Steinke et al. | ................ | 340/10.31 |

FOREIGN PATENT DOCUMENTS

EP    1 638 035 A    3/2006

* cited by examiner

*Primary Examiner*—Thomas J Mullen
(74) *Attorney, Agent, or Firm*—Jonathan W. Hallman; MacPherson Kwok Chen & Heid LLP (57) ABSTRACT

An RFID verifier is configured to vary a slope for a ramp-modulated interrogating signal to determine the slope at which an interrogated RFID tag no longer responds to the interrogating signal. In this fashion, the RFID verifier may obtain a measure of quality for the interrogated RFID tag with respect to the tag's ability to decode ramp-modulated signals.

20 Claims, 8 Drawing Sheets

RFID VERIFIER

RELATED APPLICATION

This application is a continuation-in-part of U.S. application Ser. No. 10/942,200, filed Sep. 16, 2004, now U.S. Pat. No. 7,221,278, which is hereby incorporated by reference in its entirety.

FIELD OF INVENTION

The present invention relates generally to RFID applications. More particularly, the present invention relates to an RFID reader or interrogator configured to verify RFID transponder operation.

BACKGROUND

Radio Frequency Identification (RFID) systems represent the next step in automatic identification techniques started by the familiar bar code schemes. Whereas bar code systems require line-of-sight (LOS) contact between a scanner and the bar code being identified, RFID techniques do not require LOS contact. This is a critical distinction because bar code systems often need manual intervention to ensure LOS contact between a bar code label and the bar code scanner. In sharp contrast, RFID systems eliminate the need for manual alignment between an RFID tag and an RFID reader or interrogator, thereby keeping labor costs at a minimum. In addition, bar code labels can become soiled in transit, rendering them unreadable. Because RFID tags are read using RF transmissions instead of optical transmissions, such soiling need not render RFID tags unreadable. Moreover, RFID tags may be written to in write-once or write-many fashions whereas once a bar code label has been printed further modifications are impossible. These advantages of RFID systems have resulted in the rapid growth of this technology despite the higher costs of RFID tags as compared to bar code labels.

Although RFID systems have certain advantages over bar coding schemes, they share many concerns as well. For example, bar code scanners can merely read a bar code label; they cannot provide a measure of quality. Because a marginal bar code may be readable by one scanner but not another, users have no way of reliably detecting the marginal bar codes using conventional bar code scanners. Thus, bar code verifiers have been developed to measure bar code quality metrics such as contrast, average bar deviation, and related quality indicia. Marginal bar code labels may thus be identified by bar code verifiers, thereby assuring users that their products may be reliably identified. The same concern for quality applies to RFID tags as well. However, the backscatter modulation commonly used to read information from passive RFID tags complicates the RFID verification process. In backscatter modulation, the interrogating RF beam itself provides the power for the RFID tag to respond. One verification metric would thus be how well a given RFID tag absorbed RF energy and retransmitted the energy to the RFID reader. But RF energy is absorbed by many objects in an RFID tag's environment. A conventional RFID reader has no way of determining whether a tag has absorbed RF energy or whether the absorption occurred due to environmental effects. Instead, a conventional RFID reader can merely determine the signal-to-noise ratio (SNR) of the backscattered signal from a passive RFID tag. A marginal RFID tag may be malfunctioning but illuminated with enough RF energy that the backscattered signal provided a sufficient SNR so that the RFID tag's signal may be decoded correctly. This same marginal RFID tag may be unreadable in less pristine RF environments. If an RFID tag could be verified to a known standard, such marginal RFID tags could be detected and replaced.

The need to verify RFID tags to a known standard is exacerbated by other RFID system properties. For example, RFID tags are not what-you-see-is-what-you-get (WYSIWYG) whereas a bar code label is. In other words, it doesn't matter what type of article a bar code label is affixed to because readability of the label is not affected, for example, by the article's color. However, the readability of an RFID tag may be strongly affected by the environment in which it is located. Thus, it is not possible to create a golden standard without knowledge of an RFID tag's context or environment. Moreover, because RFID tags can be physically or electrically damaged in transit, RFID systems are complicated by the need to find a safe position for the RFID tag. The juggling of RFID tag placement with RF absorption from the tag's environment can be a formidable task. Finally, the programmability of RFID tags requires that the fidelity of the RF link between an RFID reader and the RFID tag being interrogated must be relatively flawless. Accordingly, there is a need in the art to provide an RFID verifier that can more accurately verify operation of RFID tags using context-sensitive quality standards.

SUMMARY

In accordance with one aspect of the invention, an RFID verifier is provided. The RFID verifier includes: a transceiver operable to interrogate with an interrogating signal an RFID tag and to receive a resulting backscattered signal from the interrogated RFID tag; and a processor operable to vary a slope of a ramp modulation for the interrogating signal.

In accordance with another aspect of the invention, a method interrogating the RFID tag with an interrogating RF signal is provided. The method includes the acts interrogating an RFID tag with an interrogating RF signal; ramp-modulating the interrogating RF signal; and varying a slope for the ramp modulation to determine a first measure of quality for the RFID tag.

In accordance with another aspect of the invention, an RFID verifier is provided that includes: a transceiver operable to interrogate with an interrogating signal an RFID tag and to receive a resulting backscattered signal from the interrogated RFID tag; means for measuring the interrogating signal power; means for measuring the signal power from the interrogated RFID tag; means for comparing the measured interrogating signal power and RFID tag signal power to obtain a first measure of quality for the interrogated RFID tag; and means for varying a ramp modulation for the interrogating signal power to obtain a second measure of quality of the interrogated RFID tag.

DETAILED DESCRIPTION

Figure 1:
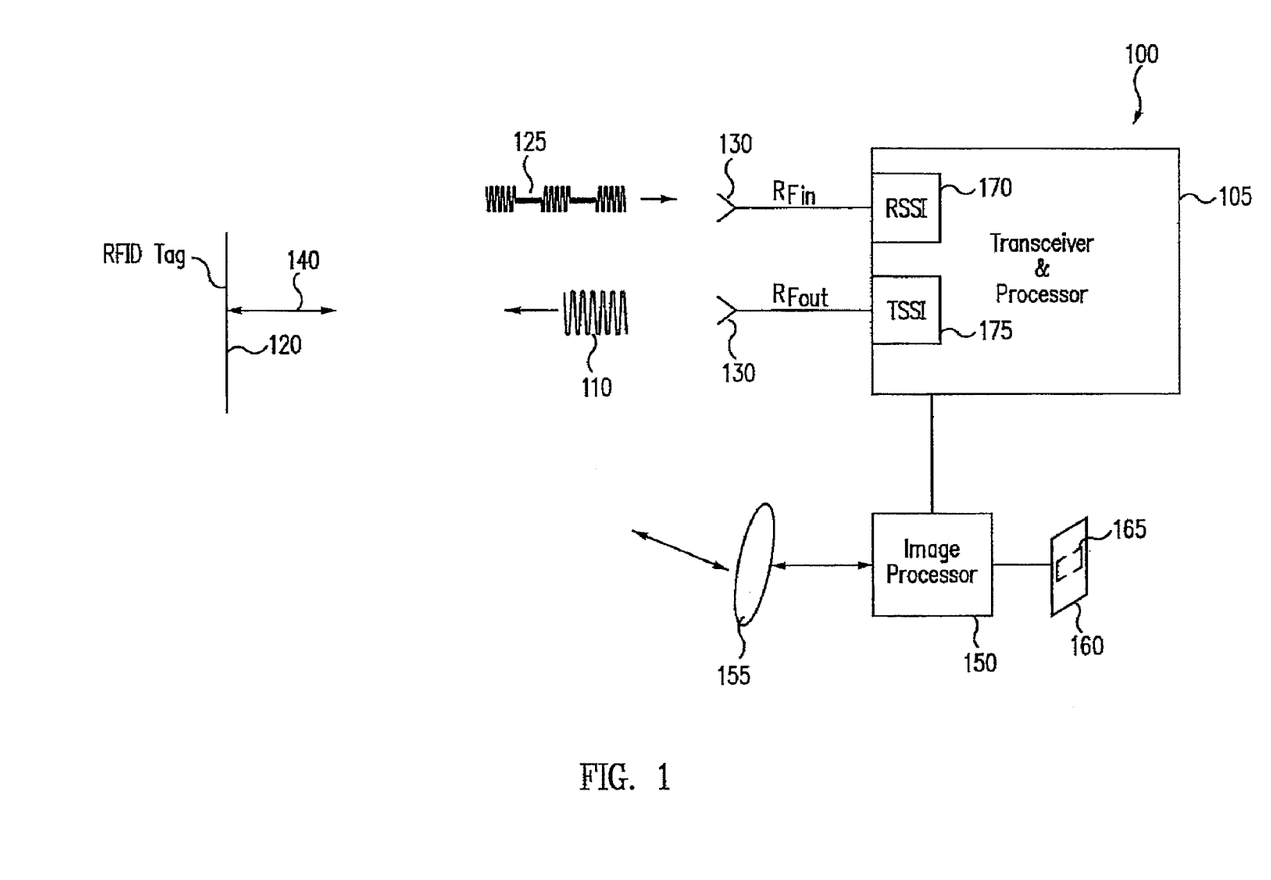
FIG. 1 is a block diagram of an RFID verifier in accordance with an embodiment of the invention.

Turning now to the Figures, a block diagram of an exemplary RFID verifier 100 is shown in FIG. 1. RFID verifier 100 includes an RF transceiver and processor 105. As known in the RFID art, transceiver transmits an RF signal 110 to provide power to a passive RFID tag 120. Having thus been provided energy, the passive RFID tag modulates the RF signal 110 and backscatters an encoded RFID signal 125 to RF transceiver 105. Transceiver 105 includes separate RF antennas 130, one for transmitting RF signal 110 and another for receiving encoded RFID signal 125. However, it will be appreciated that other embodiments of RF transceiver 105 could use a single antenna for both transmission and reception.

During verification, it is desirable that RFID verifier 100 be located in an optimum location for interrogating RFID tag. For example, RFID tag 120 may include a dipole antenna having a maximum gain in a boresight direction 140. To get a measure of the quality for RFID tag 120, verifier 100 should be located such that the maximum gains of antennas 130 are also in the boresight direction 140. If verifier 100 is not optimally oriented in this fashion, an otherwise acceptable RFID tag 120 may be deemed of low quality simply because antennas 120 and 130 are not oriented to transmit and receive the maximum achievable RF energy. An analogous orientation must be made during verification of bar code labels in that if the bar code verifier is not normally directed to the bar code label, the resulting skew affects the quality of the bar code decryption. It will be appreciated that RFID tag 120 could be provided with fiducials such that a trained technician would understand how to manually orient RFID verifier 105 in the optimal orientation with respect to the tag's fiducials.

To eliminate the need for a trained technician who would appreciate, for example, that if a tag's antenna is a dipole antenna, how to properly orient RFID verifier 100 with respect to this dipole's boresight, embodiments of RFID verifier 100 will include intelligence to assist an operator in the proper orientation. For example, RFID verifier 100 may include an image processor 150 coupled to a lens assembly 155 and a display 160. Depending upon the desired orientation of verifier 100, a user would orient the such that an image of RFID tag 120 in display 160 is centered within fiducials 165. Alternatively, as will be explained further herein, verifier 100 may include a GPS unit (not illustrated) so as to assist in the proper orientation of verifier 100.

To provide an indicia of tag quality, verifier 100 includes a received signal strength indicator (RSSI) 170 and a transmitted signal strength indicator (TSSI) 175. Rather than use relative indicia such as SNR or bit error rate, RSSI 170 should be configured such that it provides a calibrated indication of the received signal strength. In this fashion, processor 105 may compare transmitted power for RF signal 110 as provided by TSSI 175 to received power for encoded RFID signal 125. For example, based upon this comparison, RFID tags could be sorted into "A" level, "B" level, and "C" level categories. Advantageously, this comparison can be made for RFID tags that are on packages in a production setting. Marginal RFID tags may then be immediately detected and replaced as necessary.

Figure 2:
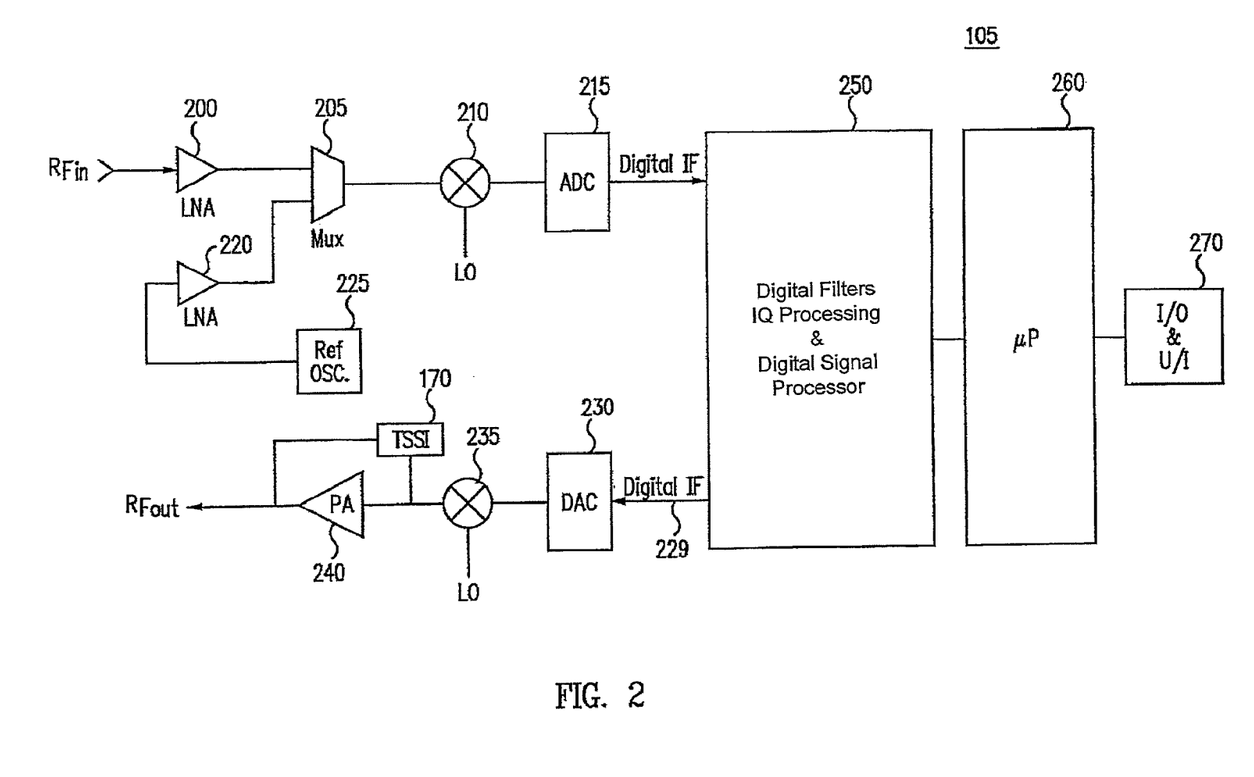
FIG. 2 is a schematic illustration of an RF transceiver for the RFID verifier of FIG. 1.

Turning now to FIG. 2, a schematic illustration for an exemplary embodiment of a superheterodyne transceiver 105 is shown. It will be appreciated, however, that baseband or homodyne architectures may also be implemented. A low noise amplifier (LNA) 200 amplifies a received RF signal denoted as $RF_{in}$ (signal 125 in FIG. 1) to provide an input to an RF multiplexer (MUX) 205. After coupling through RF MUX 205, the amplified received RF signal is downconverted to IF in a mixer 210 responsive to a local oscillator (LO) signal. The downconverted analog IF signal from mixer 210 may then be digitized in an analog-to-digital converter (ADC) 215 to provide a digital IF signal. A digital transceiver 250 decodes the digital IF to identify the RF tag being interrogated. In addition this decoding may be used to provide other indicia of quality such as bit error rate (BER).

As discussed in the background section, verification based upon a relative variable for the received RF signal such as SNR would be error prone because the resulting RFID verifier would have no way of distinguishing, for example, an otherwise-acceptable RFID tag located within an RF absorbing environment from an unacceptable RFID tag located in a pristine RF environment. To provide an accurate received signal strength indication, an LNA 220 matched to LNA 200 amplifies a reference signal from a reference oscillator 225 to provide an amplified reference signal to RF MUX 205. Thus, through operation of RF MUX 205, either the amplified reference signal or the amplified received RF signal is downconverted in mixer 210 and then digitized in ADC 215. Reference oscillator 225 is calibrated such that if MUX 205 selects the amplified reference signal, the resulting digitized IF reference signal is also of known power because the gain of LNA 220 is known. In this fashion, the digitized IF received signal may be compared to a digitized reference IF signal of known power such that an absolute power value for the digitized IF received signal may be obtained through the comparison.

An analogous measurement is made for an RF signal (denoted as $RF_{out}$) that will couple to the transmitting antenna 130 (FIG. 1) to provide transmitted RF signal 110. To provide RFout, transceiver 100 generates a digital IF signal 229 that is converted into analog form in a digital-to-analog converter (DAC) 230. It will be appreciated that reference oscillator 225 may be formed in an analogous fashion: the generation of a reference digital IF signal that is then upconverted according to a reference RF signal. Digital IF signal 229 is up converted to RF in a mixer 235 responsive to the LO signal. A power amplifier 240 amplifies the resulting RF signal to provide $RF_{out}$. It will be appreciated that transmitting antenna 130 has internal losses such that the power of transmitted RF signal 110 is less than the power in $RF_{out}$. It is desirable, however, to accurately know the power of the transmitted RF signal 110 to properly verify an RFID tag. Thus, TSSI 175 receives both the input to power amplifier 240 and its output. Because the gain of power amplifier 240 is known, TSSI 175 can then calculate the power for transmitted RF signal 110, thereby accounting for any losses introduced by transmitting antenna 130.

It will be appreciated that numerous processing architectures may be used to process the received digital IF signal and to generate the transmitted digital IF signal. For example, a transceiver 250 including digital filters, I/Q demodulators, and a digital signal processor may be used to process and generate these signals. Higher-level functions would be implemented within a microprocessor 260. An input/output and user interface module 270 allows a user to interact with microprocessor 260. Regardless of the particular architecture implemented, the use of RSSI 170 and TSSI 175 enables an accurate verification of RFID tags.

Prior to verification of an RFID tag, the optimum range between the tag and verifier 100 should be determined. This optimal range may be experimentally determined or be provided by the manufacturer of the RFID tag being verified. A user of verifier 100 may perform an experimental determination by making received signal strength measurements at varying ranges in the boresight direction 120 for RFID tag 120.

Figure 3:
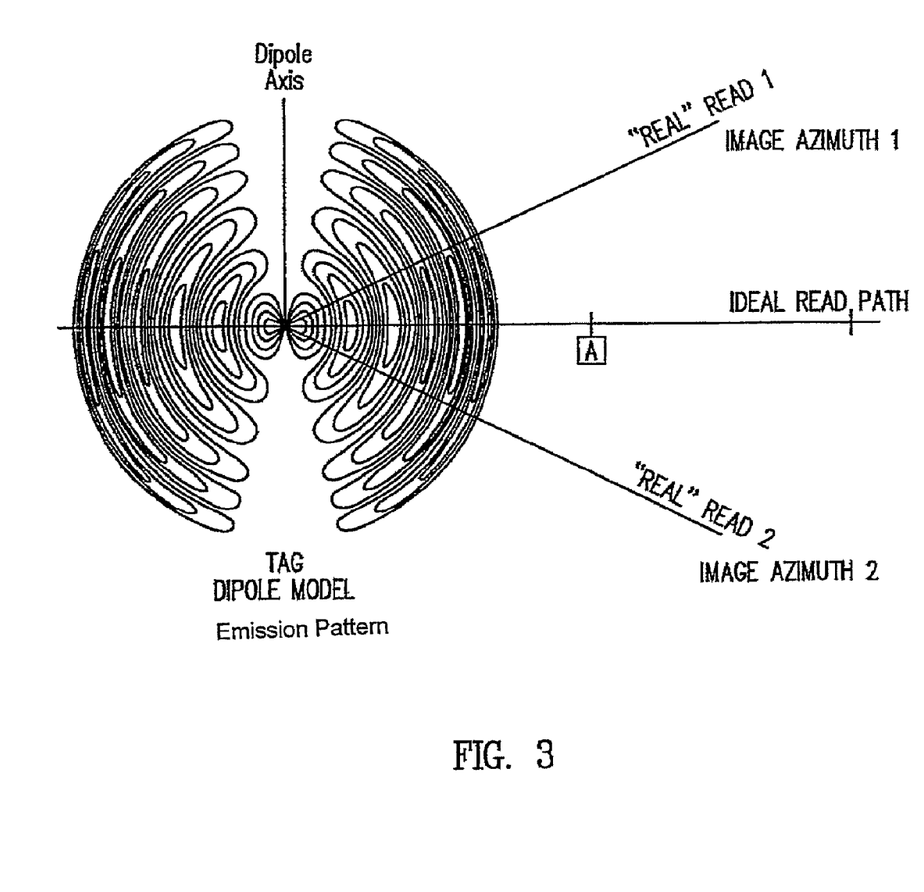
FIG. 3 illustrates an RFID tag antenna emission pattern with respect to an azimuth scan by an RFID verifier in accordance with an aspect of the invention.
Figure 4:
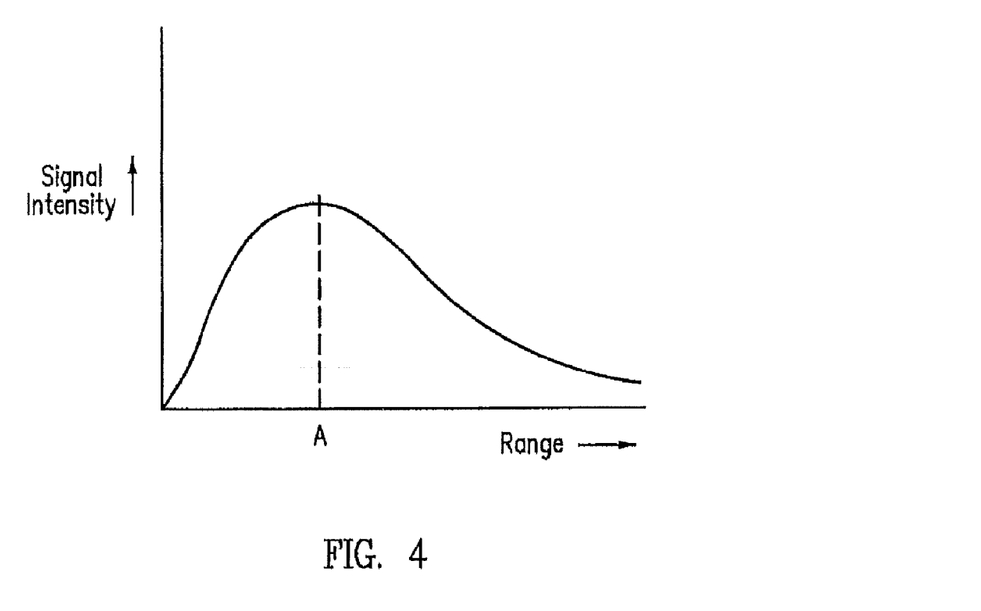
FIG. 4 is a graph of the signal intensity as a function of range.

These range-varying measurements may be better explained with respect to a typical antenna emission pattern for an RFID tag dipole antenna shown in FIG. 3. As can be seen from the emission pattern, transmitted RF energy from the antenna drops off as angular displacements are made from boresight direction 140, which is denoted as the ideal read path in FIG. 3. For example, measurements made at the angular displacements denoted as azimuth 1 and azimuth 2 will mischaracterize the transmitted signal strength. However, measurements made in the boresight direction 140 will measure the strongest emissions from the RFID antenna. An exemplary graph of measurements made along boresight direction 140 is shown in FIG. 4. It can be seen that transmitted signal strength from the RFID tag peaks at an ideal read position A. Should measurements occur any closer to RFID tag 120 than position A, near-field effects decrease the transmitted signal strength. Similarly, should measurements occur at ranges further than position A from RFID tag 120, far-field effects decrease the transmitted signal strength. A typical range for ideal read position A is approximately three meters. However, it will be appreciated that an ideal read position for a given RFID tag will depend upon the type of antenna being implemented within the given RFID tag.

Having determined the ideal read position, the corresponding range from RFID tag 120 to verifier 100 may be used to size fiducials 165 such that a user may readily manually orient verifier 100 at the proper range by aligning fiducials 165 with RFID tag 120. It will be appreciated that verifier 100 may be configured with varying sets of fiducials 165 corresponding to varying types of RFID tags being verified. Depending upon the particular RFID tag being verified, a user could, for example, select from a pull down menu the appropriate fiducials 165.

Having been configured with the appropriate fiducials 165, a user may manually locate verifier 100 such that RFID tag 120 is centered within fiducials 165, thereby assuring that verifier 100 is located at the range of the ideal read position A from RFID tag 120. By introducing the appropriate skew to fiducials 165, a desired angular displacement from boresight direction 140 may be achieved. It will be appreciated that the alignment of fiducials 165 is with respect to RFID tag physical landmarks such as the tag outline. If the RFID tag antenna is assumed to be aligned in a precise fashion with the tag physical landmarks, then the alignment of fiducials 165 with the physical landmarks of the RFID tag produces a corresponding alignment with the RFID tag antenna. In such a case, fiducials 165 may be oriented such that by aligning them with the physical landmarks of the RFID tag being verified, a user will locate verifier 100 at the ideal read position A. However, the alignment of an RFID tag antenna may be skewed or unknown with respect to the physical landmarks. In such a case, verifier 100 may be configured to locate fiducials 165 within display 160 such that a user will scan across the transmitted RF beam from RFID tag 120 to find the maximum antenna gain direction 140. Verifier 100 may then locate fiducials 165 appropriately so that a user will align verifier 100 in the maximum antenna gain direction 140. Because the ideal range has already been predetermined and accounted for in the dimensions of fiducials 165, verifier 100 will then be at the ideal read position A discussed with respect to FIG. 3.

Figure 5:
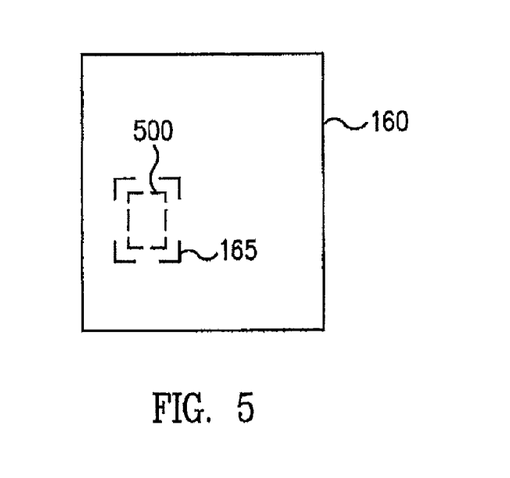
FIG. 5 illustrates a verifier display having fiducials oriented such that the verifier may be located at a predetermined angular displacement from the RFID tag antenna boresight.
Figure 6:
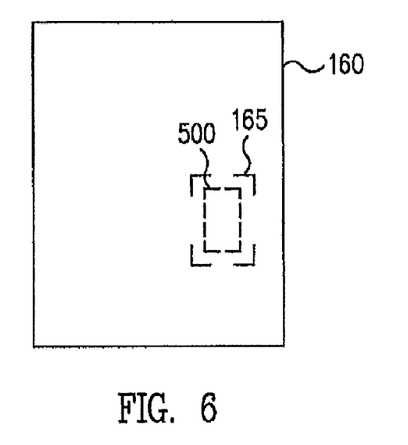
FIG. 6 illustrates the verifier display of FIG. 5 having the fiducials oriented such that the verifier may be located at another predetermined angular displacement.
Figure 7:
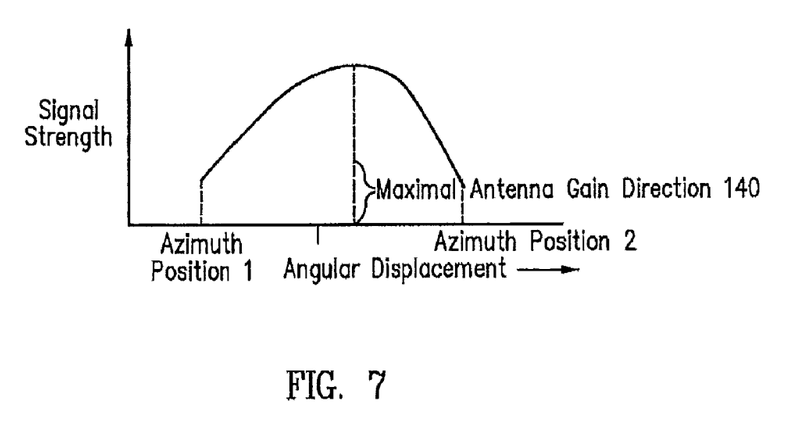
FIG. 7 is a graph of the signal strength profile as a function of angular displacement resulting from a scan between the angular displacements of FIGS. 5 and 6.

This scanning procedure may be better understood with reference to FIGS. 5 and 6. FIG. 5 shows an exemplary arrangement of fiducials 165 within display 160 such that when RFID tag physical landmarks 500 are aligned within fiducials 165, verifier 100 is offset from the maximum antenna gain direction 140. For example, fiducials 165 may be arranged such that verifier 100 is displaced to read position azimuth 1 as shown in FIG. 3. After the received signal strength is measured at read position azimuth 1, fiducials 165 may be aligned within display 160 as seen in FIG. 6 such that a user will be forced to scan across the antenna beam to another read position such as the read position for azimuth 2 in FIG. 3. As the user scans across the antenna beam, the verifier 100 continues to sample the antenna beam to measure received signal strength. In this fashion, a profile of the received signal strength may be expected as seen in FIG. 7. To form this profile, verifier 100 may monitor the location of the physical landmarks 500 within display 160 at the time of each measurement. For example, if a user scans slowly in a first portion of the scan and then scans more rapidly in a second portion of the scan, the profile should reflect that the measurement points within the first portion are more closely spaced than the measurement points in the second portion of the scan. By correlating the time of each measurement with the position of physical landmarks 500 within display 160 at each measurement time, each measurement may be located at the correct angular displacement as seen in FIG. 7. Verifier 100 may then analyze the profile to determine the maximum antenna gain direction 140. Having located maximum antenna gain direction 140, verifier may locate fiducials 165 within display 160 such that a user will position verifier 100 at the ideal read position A. Verification of RFID tag 120 may then proceed as discussed herein.

Figure 8:
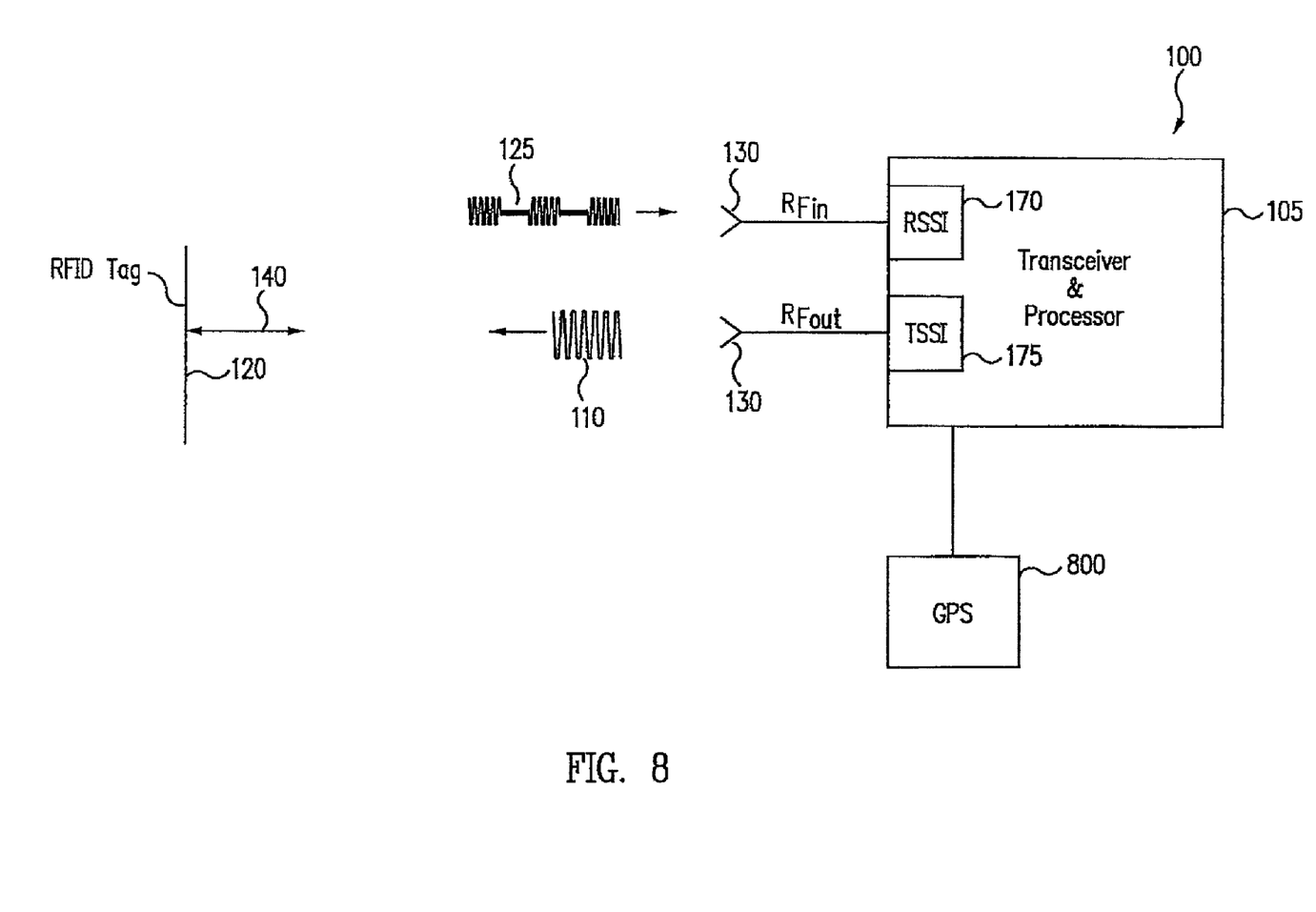
FIG. 8 is a block diagram of an RFID verifier in accordance with an embodiment of the invention.

In an alternative embodiment, rather than employ a visual orientation approach as just discussed, verifier 100 may be configured with a global positioning system (GPS) 800 as seen in FIG. 8. To perform an antenna beam scan, a user may first measure the coordinates of RFID tag 120. Knowing these coordinates, verifier 100 may then calculate the coordinates of the read position at azimuth 1 and 2 as discussed with respect to FIG. 3. The user would be instructed to move verifier 100 accordingly such that it scans across the antenna beam to form a profile as discussed with respect to FIG. 7.

Figure 9:
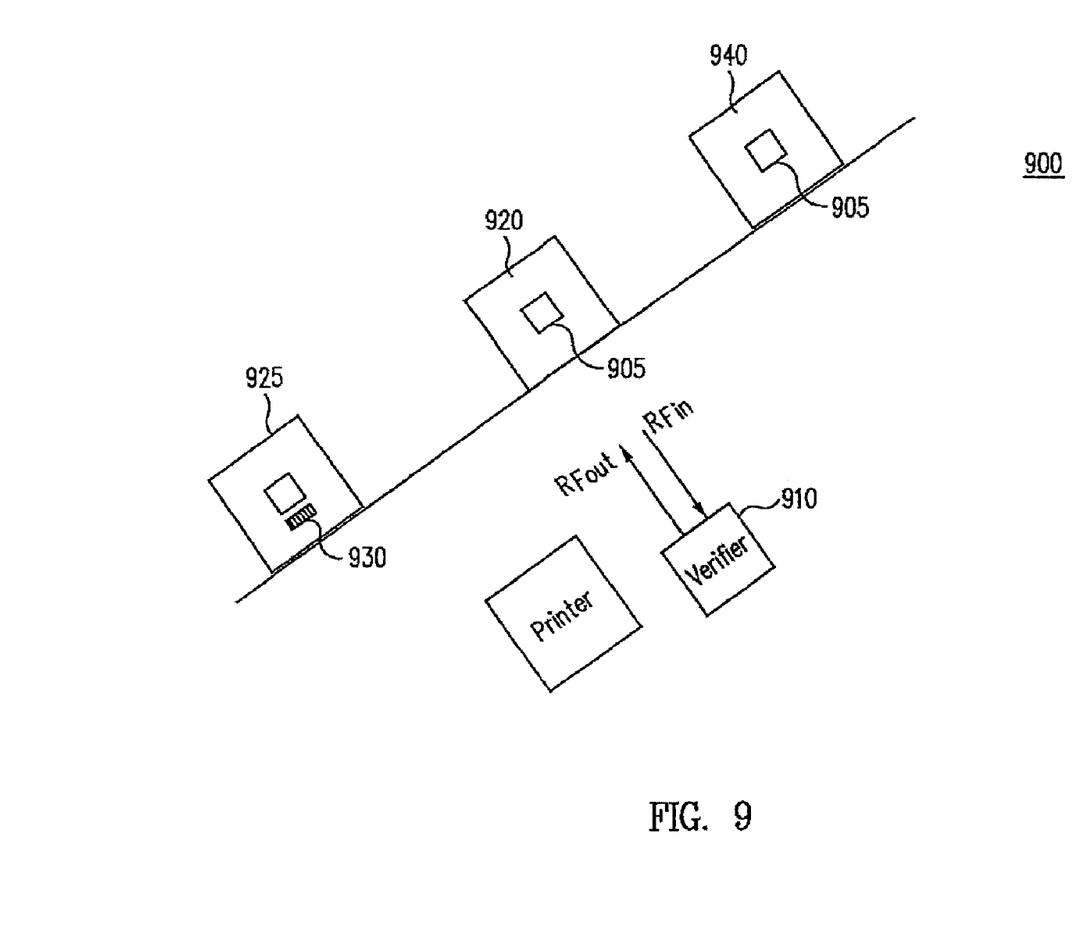
FIG. 9 illustrates a system having a verifier integrated with a bar code printer in accordance with an embodiment of the invention.

Regardless of how the ideal read position discussed with respect to FIG. 3 is determined, a verifier may then be located at this ideal position. This is akin to locating a bar code label verifier normally with respect to the bar code label surface. It will be appreciated that having found the ideal read position, the verifier being located at this ideal read position need not be configured to include any imaging capability as discussed with respect to FIGS. 5, 6, and 7. Instead, a verifier that merely possesses the TSSI and RSSI capabilities discussed with respect to FIG. 2 is sufficient. This verifier may classify tags according to levels of quality as discussed previously. Having been mounted at the ideal read position, the verifier may then be integrated or associated with a bar code printer. Bar code labels printed by the bar code printer supplement or duplicate RFID tag information as known in the art. An article having an RFID tag would also have a bar code label as printed by the bar code printer. However, because the verifier is associated with the bar code printer, articles having RFID labels that are not of a suitable quality level may be rejected immediately. An exemplary printer/verifier system 900 is shown in FIG. 9. Articles having RFID tags 905 are transported sequentially past a verifier 910. When each RFID tag 905 is sequentially located such that verifier 910 is at the ideal read location, the transportation is momentarily stopped so that the ideally-located RFID tag 905 may be verified. For example, article 920 has been stopped so that its RFID tag 905 is the one being verified. An article 925 has already had its tag verified. Thus, a bar code label 930 from a bar code printer 935 has been applied to article 925. After article 920 has had its tag verified, an article 940 may be transported to the ideal read location, stopped, and have its tag verified, and so on. Those articles whose RFID tags 905 are not of suitable quality will be identified so that their RFID tags 905 may be replaced.

Consider the advantages of system 900—because the verification of RFID tags is context dependent, another verifier may be used to determine the worst-case scenario for subsequent verification of articles such as article 920. Having been shipped to a customer or intermediate location such as a warehouse, a user at these subsequent locations will want to be assured that the previously-verified RFID tags 905 are still readable. The use of a verifier as discussed previously may determine the levels of quality and thus the transfer function from the production facility to these subsequent locations. For example, the transfer function may be such that an "A" level tag at the production facility becomes a "B" level tag in the context of a customer's warehouse. Similarly, a "B" level tag may become a "C" level tag under this transfer function. If the user determines that only "B" level tags are acceptable at its warehouse, then system 900 at the production facility will only pass "A" level tags given this transfer function.

As just described, verifier 910 bases its quality gradations for the verified tags solely upon the RF energy interrogation of the tag being verified. However, it will be appreciated that these gradations may also be affected upon other contextual information. For example, a user of verifier 910 may recognize that a certain class of articles are having their RFID tags verified. Alternatively, this recognition may be automated through a machine reading of SKU information. Given this contextual information, verifier 910 may alter its gradations accordingly. For example, whereas the same verified quality for one type of article may be classified as an "A" grade, this same verified quality for another type of article may be classified as a "B" grade.

Figure 10:
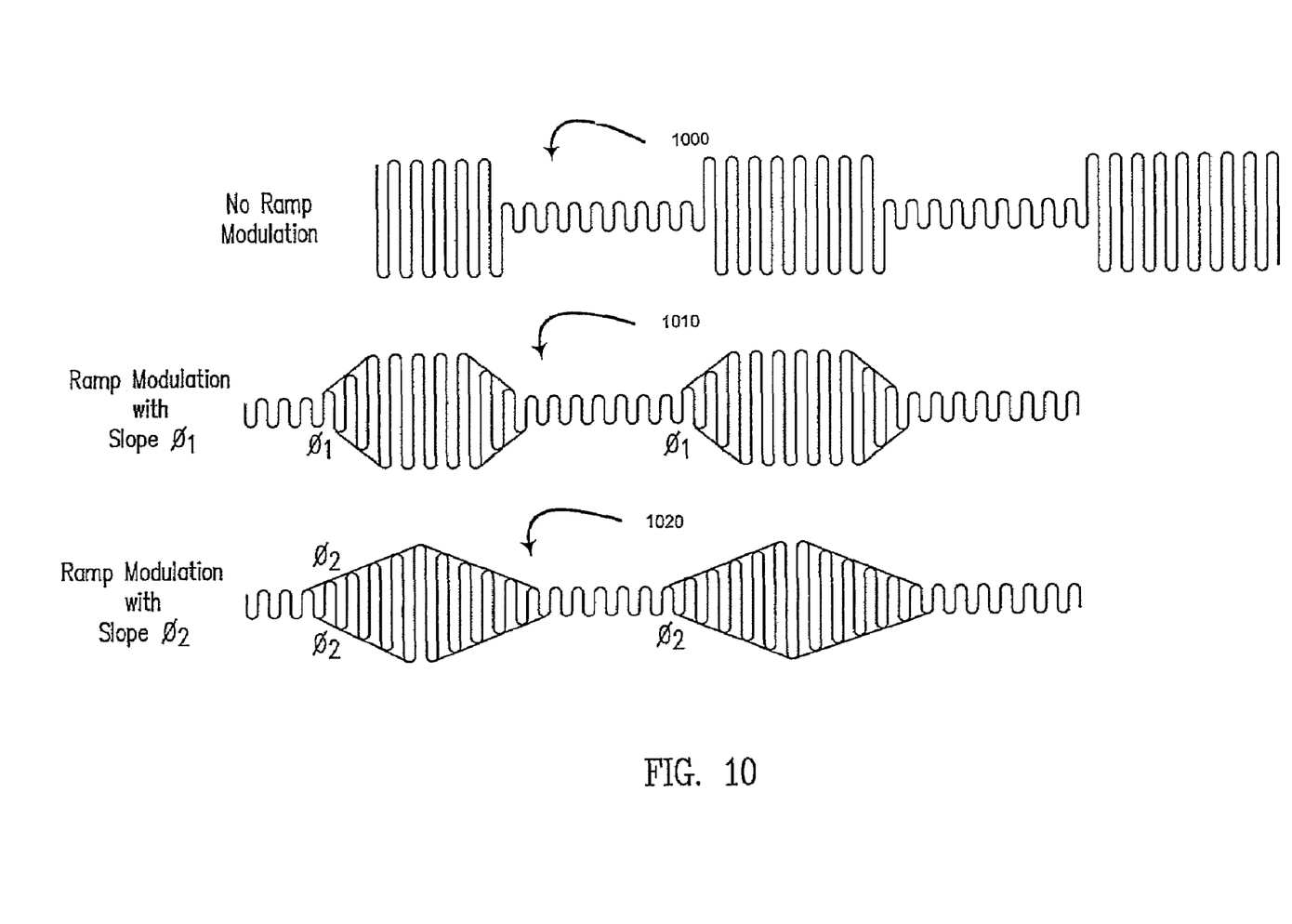
FIG. 10 illustrates an RFID interrogating waveform without ramp modulation and RFID interrogating waveforms with ramp modulation.

Turning now to FIG. 10, a conventional interrogation signal waveform 1000 is illustrated. The carrier signal is ASK modulated to carry information to the interrogated tag. The sharp transitions in amplitude that are inherent in a classic ASK modulation introduce many harmonics in the resulting spectrum for the interrogation signal. These harmonics may cause undesirable radio interference in bandwidths that a user does not want to interfere with. Thus, interrogators have been developed that use a ramped amplitude transition period during the ASK modulation. For example, interrogation signal waveform 1010 demonstrates such ramped transitions between high amplitude and low amplitude signal states. This ramping occurs at a slope defined by an angle $\phi_1$. This slope may be decreased such as demonstrated by an interrogation signal waveform 1020 having a slope of $\phi_2$. As the slope is decreased, the undesirable harmonics are reduced further. However, at some point, the interrogated tag can no longer discern any data from the ASK modulation. Referring back to FIG. 1, transceiver 100 may be configured to determine the slope $\phi$ for ramp-modulated interrogation signals at which RFID tag 120 no longer responds correctly. In other words, transceiver 100 could begin interrogation with a conventional ASK modulated signal 110 without any ramp modulation. Transceiver 100 would then introduce a slope $\phi$ slightly less than 90 degrees that would then be gradually decreased. At some point (for example, 30 degrees), the RFID tag would no longer respond to the interrogation. Transceiver 100 may thus classify tags not only with regard to the returned signal power (based upon a known interrogation power) but also upon their response to ramp modulation. A given RFID tag may be an "A" level tag with regard to one category such as its response to ramp modulation but be a "C" level tag with regard to returned signal strength.

It will be appreciated that numerous modifications may be made to the preceding description. For example, the scanning process may be automated. In an automated embodiment, a verifier may be movably located on a mechanized positioner. The verifier would control the mechanized positioner so that a scan may be performed. Accordingly, although the invention has been described with respect to particular embodiments, this description is only an example of the invention's application and should not be taken as a limitation. Consequently, the scope of the invention is set forth in the following claims.

What is claimed is:

1. An RFID verifier, comprising:
   a transceiver operable to interrogate with an interrogating signal an RFID tag and to receive a resulting backscattered signal from the interrogated RFID tag; and
   a processor operable to vary a slope of a ramp modulation for the interrogating signal to obtain a first measure of quality for the interrogated RFID tag.

2. The RFID verifier of claim 1, wherein the transceiver is a superheterodyne transceiver.

3. The RFID verifier of claim 1, wherein the transceiver is a homodyne transceiver.

4. The RFID verifier of claim 1, further comprising:
   a transmit signal strength indicator operable to measure an interrogating signal power for the interrogating signal; and
   a received signal strength indicator operable to measure a power of the backscattered signal; wherein the processor is further operable to compare the interrogating signal power and power for the backscattered signal to obtain a second measure of quality for the interrogated RFID tag.

5. The RFID verifier of claim 1, further comprising:
   a display operable to display an image of the interrogated RFID tag, wherein the RFID verifier is configured such that fiducials on the display guide a user to locate the RFID verifier at a desired range from the interrogated RFID tag.

6. The RFID verifier of claim 5, wherein the RFID verifier is further configured so that the fiducials are oriented within the display such that if the RFID verifier is oriented so that the interrogated RFID tag has a predetermined relationship with the oriented fiducials, the oriented RFID verifier has a predetermined angular orientation with respect to an antenna beam for the interrogated RFID tag.

7. The RFID verifier of claim 6, wherein the oriented RFID verifier is also at a predetermined range from the interrogated RFID tag.

8. The RFID verifier of claim 7, wherein the predetermined relationship of the interrogated RFID tag and the oriented fiducials is that the interrogated RFID tag is centered within the oriented fiducials.

9. The RFID verifier of claim 8, wherein the RFID verifier is further configured so that the fiducials may be oriented within the display at a first orientation and at a second orientation such that if the RFID verifier is first oriented so that the interrogated RFID tag has a predetermined relationship with the first-oriented fiducials, the first-oriented RFID verifier has a first predetermined angular orientation with respect to the antenna beam for the interrogated RFID tag and such that if the RFID verifier is second oriented so that the interrogated RFID tag has a predetermined relationship with the second-oriented fiducials, the second-oriented RFID verifier has a second predetermined angular orientation with respect to the antenna beam for the interrogated RFID tag, the first angular orientation and the second angular orientation being on opposing sides of the antenna beam.

10. The RFID verifier of claim 6, wherein the RFID verifier is further configured to measure the backscattered signal power as the RFID verifier is moved from a first angular orientation to a second angular orientation.

11. The RFID verifier of claim 1, further comprising:
a GPS module operable to determine GPS coordinates of the interrogated RFID tag and the RFID verifier.

12. The RFID verifier of claim 11, wherein the RFID verifier is configured to process the GPS coordinates of the interrogated RFID tag to determine desired GPS coordinates of the RFID verifier such that if the RFID verifier is located at the desired GPS coordinates, the located RFID verifier is at a desired range from the interrogated RFID tag.

13. The RFID verifier of claim 12, wherein the RFID verifier is further configured to process the GPS coordinates of the interrogated RFID tag to determine the desired GPS coordinates of the RFID verifier such that if the RFID verifier is located at the desired GPS coordinates, the located RFID verifier also has a predetermined angular relationship with respect to an antenna beam for the interrogated RFID tag.

14. An RFID tag verification method, comprising:
interrogating an RFID tag with an interrogating RF signal;
ramp-modulating the interrogating RF signal; and
varying a slope for the ramp modulation to determine a first measure of quality for the RFID tag.

15. The method of claim 14, wherein varying the slope comprises varying the slope until the RFID tag no longer responds to the interrogating RF signal.

16. The method of claim 14, further comprising:
measuring the power of the interrogating RF signal;
receiving a modulated RF signal from the interrogated RFID tag;
measuring the power of the received modulated RF signal; and
comparing the measured powers to provide a second measure of quality for the interrogated RFID tag.

17. The method of claim 16, wherein measuring the power of the received modulated RF signal comprises measuring the power of the received modulated signal at a plurality of locations with respect to an antenna beam for the interrogated RFID tag.

18. An RFID verifier, comprising:
a transceiver operable to interrogate with an interrogating signal an RFID tag and to receive a resulting backscattered signal from the interrogated RFID tag;
means for measuring the interrogating signal power;
means for measuring the signal power from the interrogated RFID tag;
means for comparing the measured interrogating signal power and RFID tag signal power to obtain a first measure of quality for the interrogated RFID tag; and
means for varying a ramp modulation for the interrogating signal power to obtain a second measure of quality of the interrogated RFID tag.

19. The RFID verifier of claim 18, wherein the transceiver is a superheterodyne transceiver.

20. The RFID verifier of claim 18, wherein the transceiver is a homodyne transceiver.

* * * * *